Figure 1:
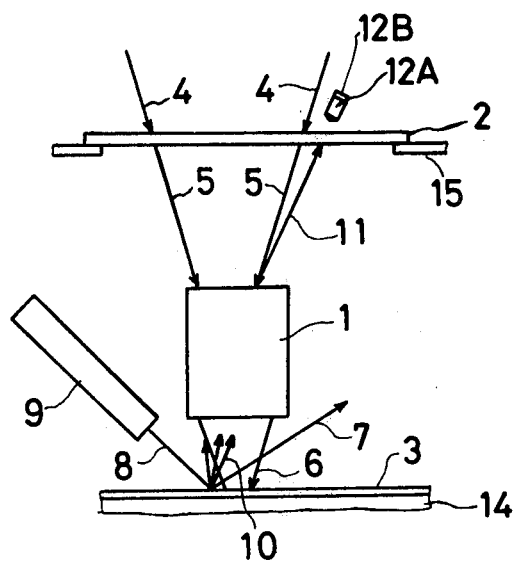

United States Patent [19]

Imahashi

[11] 4,441,250
[45] Apr. 10, 1984

[54] APPARATUS FOR REGISTERING A MASK PATTERN IN A PHOTO-ETCHING APPARATUS FOR SEMICONDUCTOR DEVICES

[75] Inventor: Issei Imahashi, Yamanashi, Japan

[73] Assignee: Telmec Co., Ltd., Nirasaki, Japan

[21] Appl. No.: 461,694

[22] Filed: Jan. 28, 1983

Related U.S. Application Data

[62] Division of Ser. No. 213,960, Dec. 8, 1980, Pat. No. 4,377,028.

[30] Foreign Application Priority Data

Feb. 29, 1980 [JP] Japan .................................. 55-25007

[51] Int. Cl.³ ..................... H01L 21/68; H01L 21/312
[52] U.S. Cl. .......................................... 29/578; 29/574;
250/237 G; 356/399; 356/400; 356/401
[58] Field of Search ......................... 29/574, 578, 579;
250/237 G; 356/399, 400, 401

[56] References Cited

U.S. PATENT DOCUMENTS

| | | | |
|---|---|---|---|
| 3,802,940 | 4/1974 | Villers et al. | 148/187 |
| 3,928,094 | 12/1975 | Angell | 29/578 X |
| 4,037,161 | 7/1977 | Westell | 356/373 X |
| 4,070,117 | 1/1978 | Johannsmeier et al. | 29/574 X |
| 4,187,431 | 2/1980 | Hundt | 29/578 |
| 4,200,395 | 4/1980 | Smith | 356/400 X |
| 4,211,489 | 7/1980 | Kleinknecht et al. | 250/237 G X |
| 4,232,969 | 11/1980 | Wilezynski | 356/401 |
| 4,377,028 | 3/1983 | Imahashi | 29/574 |

*Primary Examiner*—G. Ozaki
*Attorney, Agent, or Firm*—Price, Heneveld, Huizenga & Cooper

[57] ABSTRACT

An apparatus is provided for registering a pattern on a mask plate with a pattern already formed on a semiconductor wafer. A reflector group is provided on the wafer comprising a plurality of reflectors having a predetermined shape, interval and alignment. Two window groups are provided at predetermined positions on the mask plate. Each window group comprises a plurality of windows having a predetermined shape, interval and alignment that corresponds to the shape, interval and alignment of the reflector group. One of the window groups is provided with a staggered phase relationship with the other window group such that when one of the wafer or the mask plate is moved relative to the other, variations in the quantity of light reflected by the reflector group and passed through the respective window groups is used to determine the relative position of the wafer and the mask plate.

5 Claims, 7 Drawing Figures

30  31  32

40  41  42

FIG. 5
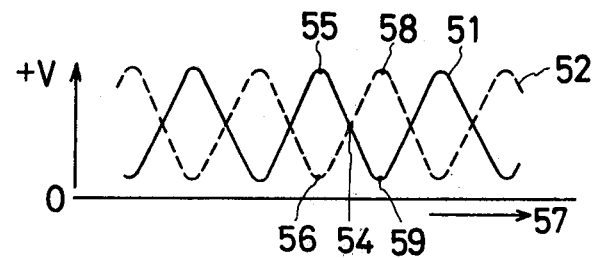
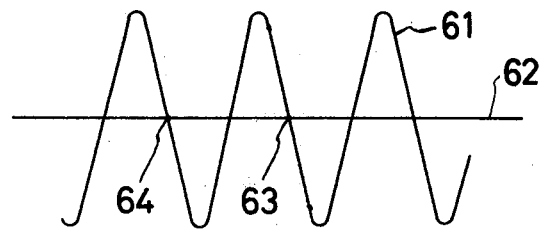
FIG. 6
FIG. 7
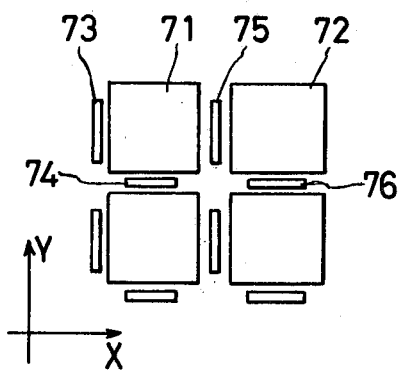

APPARATUS FOR REGISTERING A MASK PATTERN IN A PHOTO-ETCHING APPARATUS FOR SEMICONDUCTOR DEVICES

This is a division of application Ser. No. 213,960, filed Dec. 8, 1980, now U.S. Pat. No. 4,377,028.

The present invention relates to an apparatus for registering a pattern on a mask plate with a pattern already formed on a semiconductor wafer in the manufacture of semiconductor devices.

Recently, the size of patterns used to manufacture semiconductor devices has become more and more minute, and accordingly, in place of the so-called one-shot exposure process in which exposure is effected in one shot over the entire wafer surface, a process of repeatedly effecting exposure through one or a few patterns which are included within an area of, for example, about 10 mm square is being employed. In such photo-etching processes, either an X-Y stage having extremely high precision is used to repeatedly position the wafer and make exposures or after a wafer has been moved by one pattern length by means of an X-Y stage, a mask pattern is registered with a pattern already formed on a wafer by any appropriate means and then exposure is effected. However, the former process requires that the X-Y stage should be extremely precise, and the latter process is accompanied by various difficulties in quickly positioning a wafer relative to a mask plate at high precision because the pattern formed on the wafer is generally extremely small and hence light reflected by this pattern is also very faint. In the process of repeatedly effecting exposure many times on a single wafer through a pattern plate, it is especially difficult to quickly move an X-Y stage and quickly effect registration of the patterns.

It is therefore one object of the present invention to provide an apparatus for quickly and precisely registering, a pattern on a mask plate with a pattern already formed on a semiconductor wafer in a photoetching apparatus for semiconductor devices.

Another object of the present invention is to provide a novel apparatus for registering a pattern on a mask plate with a pattern already formed on a semiconductor wafer in a photo-etching apparatus for semiconductor devices, in which a reference target such as a reflector group to be used for registering the patterns is provided on the wafer in such manner that said reference target does not obstruct the manufacture of the semiconductor devices.

In order to achieve the aforementioned objects, according to one feature of the present invention, there is provided an apparatus for registering a pattern on a mask plate with a pattern already formed on a semiconductor wafer, comprising a wafer support for holding the semiconductor wafer, a mask support for holding the mask plate, an optical system including a lens for focusing an image of the pattern of the mask plate on the semiconductor wafer and a light source for irradiating the wafer. The wafer is provided with a plurality of reflectors of predetermined shape aligned at predetermined intervals along a predetermined direction. The mask plate is provided with two window groups at predetermined positions on the mask plate in correspondence to the position of the reflector group on the wafer. each window group consisting of a plurality of windows of predetermined shape aligned at the same intervals along the same direction as the reflector group, one window group being staggered in phase with respect to the other window group. Apparatus is provided for moving one of the wafer and the mask plate relative to the other in the direction of alignment of the reflectors and windows while irradiating the reflector group with light, detecting the quantities of light reflected by the reflector group and passed through the respective window groups by means of respective photo-sensitive means, and determining the relative position of the wafer and the mask plate where the detected respective quantities of light take a predetermined proportion to thereby determine the relative position where the pattern on said mask plate is registered with the pattern already formed on said semiconductor wafer. Embodiments of the invention are also contemplated wherein two reflector groups in a staggered phase relationship are provided with a single window group.

Figure 2:
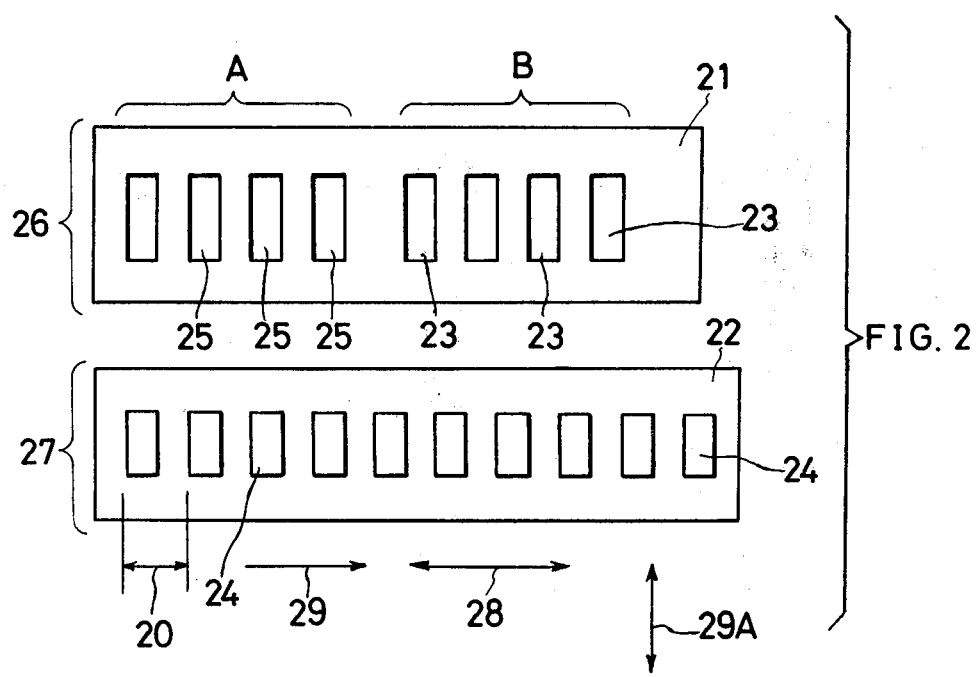
Figure 3:
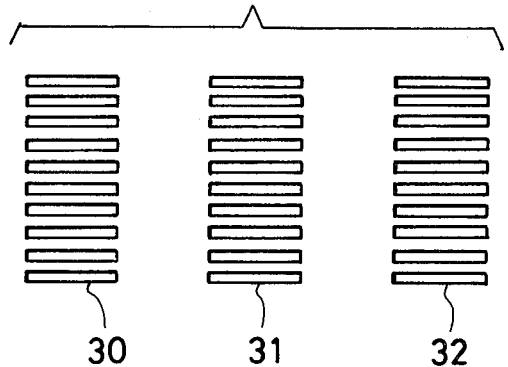
Figure 4:
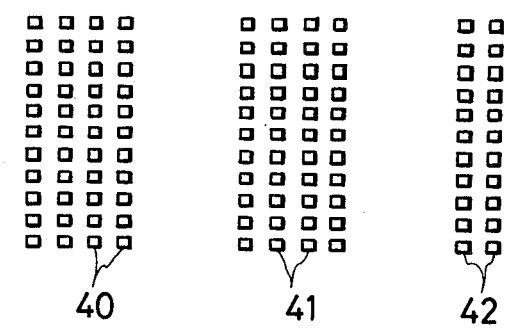

The above-mentioned and other features and objects of the present invention will become more apparent by reference to the following description of preferred embodiments of the invention taken in conjunction with the accompanying drawings, wherein:

FIG. 1 is a general schematic view of a photoetching apparatus for semiconductor wafers according to the present invention, FIG. 2 is a schematic plan view showing an outline of arrangement of a reflector group and two window groups to be used in the photo-etching apparatus according to the present invention, FIG. 3 is an enlarged schematic plan view showing one example of a part of the reflector group, FIG. 4 is an enlarged schematic plan view showing another example of a part of the reflector group, FIG. 5 is a diagram showing variations of quantities of light detected by two respective photo-sensitive means, FIG. 6 is a diagram showing a variation of a difference between the quantities of light detected by the two respective photo-sensitive means, and FIG. 7 is a schematic plan view showing locations of reflector groups formed on a semiconductor wafer according to the present invention.

Referring now to FIG. 1 of the drawings, 1 designates an optical system including a lens, which is used for projecting an image of a mask pattern for exposure on a mask plate 2 onto a semiconductor wafer 3 in an extremely reduced size, 4, 5 and 6 designate light paths upon exposure of the wafer 3 to the light through the mask plate 2, 9 designates a laser device illustrated as one example of a light source for irradiating a reflector group 27 in FIG. 2 formed on the wafer 3, 8 designates a path of light emitted from the laser device 9, and 7 designates a path of light regularly reflected by the reflector group 27. On the other hand, a number of arrows designated by numeral 10 denote paths of light reflected by diffused reflection, and an arrow 11 denotes a path of light reflected by the reflector group 27 and focused by the optical system 1 onto the mask plate 2. In other words, the reflector group 27 on the wafer 3 is irradiated by the light emitter from the laser device 9, and the image of the reflector group 27 is projected at the position of a window group 26 in FIG. 2 formed on the mask plate 2. Photo-sensitive devices 12A and 12B which are illustrated in FIG. 1 as overlapped in the direction perpendicular to the sheet of the figure, are devices for measuring intensities of light projected thereto, and each of them contains a photo-electric transducer therein. In addition, in FIG. 1 14 designates a wafer holder, and 15 designates a mask plate holder.

On example of a reflector group 27 formed on the wafer 3 and window groups 26 formed on the mask plate 2 to be used for registering the wafer and the mask plate, is illustrated in FIG. 2. In the following description, the invention will be explained assuming that reference numeral 26 designates two window groups on the mask plate 2 and reference numeral 27 designates a reflector group on the wafer 3. However, it is to be noted that the present invention can also be practiced by forming two reflector groups having the configuration shown at 26 on the wafer 3 and one reflector group having the configuration shown at 27 on the mask plate 2.

In the illustrated embodiment, the reflectors 24 look light when they are viewed through the optical system 1, whereas the remaining area 22 looks dark. The areas 25 and 23, respectively, represent two window groups A and B formed on the mask plate 2 and adapted to pass light therethrough. The light emitted from the reflectors 24 in the reflector group 27 on the wafer 3 by diffused reflection, is passed through the windows 23 or 25 and reaches the photo-sensitive device 12A or 12B. The device 12A is adapted to receive the light passed through the window group A in FIG. 2, whereas the device 12B is adapted to receive the light passed through the window group B in FIG. 2.

Now an operational discussion is presented for registering a pattern on the mask plate 2 with a pattern already formed on the semiconductor wafer 3.

With reference to FIG. 2, when the reflector group 27 and the window groups 26 are in the illustrated relationship in position along the direction indicated by arrows 28, in the range designated by reference character A, since the reflectors 24 in the reflector group 27 coincide in position with the windows 25 in the window group A, the photo-sensitive device 12A will receive a maximum quantity of light. Whereas in the range designated by reference character B in FIG. 2, since the reflectors 24 in the reflector group 27 and the windows 23 in the window group B are completely staggered in phase from each other, the photo-sensitive device 12B can receive only a minimum quantity of light. In the illustrated example, if the intervals between adjacent reflectors or adjacent windows as indicated by arrows 20 are called one pitch, then on the mask plate 2 the window group A and the window group B are said to be staggered in phase by ½ pitch from each other. Assuming now that the wafer (22 in FIG. 2) is moved in the direction of arrow 29 relative to the mask plate (21 in FIG. 2), then in the range designated by character A, since the overlap between the reflectors 24 and the windows 25 decreases gradually, the quantity of light received by the photo-sensitive device 12A is reduced successively, whereas in the range designated by character B, the overlap between the reflectors 24 and the windows 23 increases gradually, and hence the quantity of light received by the photo-sensitive device 12B is increased successively. It will be readily understood from the above description that when the wafer 22 has moved by ½ pitch relative to the mask plate 21 in the direction shown by arrow 29, the quantities of light received by the photo-sensitive devices 12A and 12B are completely reversed. If the former has moved by one pitch, then the relation between the quantities of light received by the photo-sensitive devices 12A and 12B returns to its original relationship.

FIG. 5 shows relations between the quantities of light received by the photo-sensitive device 12A and 12B, respectively, and the position of the wafer 22 moving in the direction of arrow 29 relative to the mask plate 21, the abscissa indicates the displacement of the wafer 22, and the ordinate indicates the quantities of light received by the respective photo-sensitive devices 12A and 12B. (Generally in a photo-sensitive device including a photo-electric transducer element, a variation of a quantity of light is converted into a variation of an electric current or a voltage.)

In this figure, a solid line curve 51 indicates the quantity of light received by the photo-sensitive device 12A, while a dash line curve 52 indicates the quantity of light received by the photo-sensitive device 12B. Points 55 and 56 on the respective curves 51 and 52 represent the moment when the wafer 22 and the mask plate 21 are in the positional relationship illustrated in FIG. 2, and subsequently as the wafer 22 is moved in the direction of arrow 29 shown in FIG. 2, the quantities of light received by the respective photo-sensitive devices 12A and 12B would vary along the respective curves 51 and 52 in the direction of arrow 57 in FIG. 5. Points 58 and 59 on the respective curves 52 and 51 represent the moment when the wafer 22 has been moved by ½ pitch from the relative position shown in FIG. 2.

A curve 61 shown in FIG. 6 represents a difference obtained by subtracting the quantity of light received by the photo-sensitive device 12B from the quantity of light received by the photo-sensitive device 12A. Since the quantities of light received by the respective photo-sensitive devices 12A and 12B are converted into currents or voltages, such arithmetic operations can be easily performed. As illustrated in FIG. 6, the curve 61 representing the difference swings both in the positive and negative directions relative to a zero level line, that is, an abscissa 62. Referring now to point 63 where the curve 61 crosses the abscissa 62 (that is, the point corresponding to a point 54 in FIG. 5 where the curves 51 and 52 cross with each other), this point means that the quantity of light received by the photo-sensitive device 12A is equal to the quantity of light received by the photo-sensitive device 12B. In other words, at the point 63 the relative position between the wafer 3 and the mask plate 2 is displaced by ½ pitch from the relative position illustrated in FIG. 2. Although the quantities of light passed through the window groups A and B, respectively, may be varied by many causes other than the relative displacement between the wafer 3 and the mask plate 2, in such cases they would vary in substantially the same manner both in the region A and in the region B. Therefore, if the positions of the reflector group 27 and the window groups A and B on the wafer 3 and the mask plate 2, respectively, are preselected at such positions that when a curve 61 as shown in FIG. 6 is depicted by calculating the difference between the quantities of light passed through the window groups A and B, respectively, and detected by the photo-sensitive devices 12A and 12B, respectively, the points where the curve 61 crosses with the 0-level line such as points 63, 64, etc. may correspond to the position where an image of a pattern formed on the wafer 3 coicides with a mask pattern on the plane of the mask plate 2, then very conveniently the relative position between the wafer 3 and the mask plate 2 can be achieved according to the variations of the quantities of light received by the respective photo-sensitive devices 12A and 12B, respectively.

Now a method for forming the reflector group 27 on the wafer 3 will be described in connection with two examples.

The reflector group 27 is formed in the first etching step for etching a pattern on a silicon oxide film formed on a silicon wafer 3 through a photo-resist mask, and so, it consists of silicon oxide film portions and etched silicon wafer portions. Two different examples of the reflectors 24 formed on the wafer 3 as shown in FIG. 2 are illustrated in FIGS. 3 and 4, respectively. Each reflector represented by a single frame 24 in FIG. 2 is formed of a large number of small reflector regions such as a large number of thin slit regions 30, 31 or 32 in FIG. 3 or a large number of small square regions 40, 41 or 42 in FIG. 4.

When the light emitted from the light source 9 is projected along the light path 8 onto such thin slit regions 30, 31 or 32 or such small square regions 40, 41 or 42, while the light reflected regularly by the silicon oxide surface propagates mostly along the direction shown by arrow 7, at the reflector regions 30, 31, 32, 40, 41 or 42, diffused reflection occurs at the edge portions of these reflector regions as shown by arrows 10 in FIG. 1, and the light of the diffused reflection is focused by the optical system 1 on the plane of the mask plate 2. In this way, by forming each reflector 24 of an assembly of small reflector regions such as thin slots, the light reflected by the edge portions of the small reflector regions can be collected as diffused reflection light by the optical system, and thus the quantity of light received by the photo-sensitive device can be increased. It is to be noted that the region surrounding these small reflector regions reflects only a minute quantity of light and looks dark. However, even if this dark region and the small reflector regions which reflect a large quantity of light are formed in a reversed fashion, the effect of the present invention can be achieved equally.

FIG. 7 illustrates the reflector groups disposed in an exemplary fashion on a semiconductor wafer. Since the reflector groups can be formed in elongated shapes, the reflector groups can be arranged on a cutting line between adjacent semiconductor chips as shown in FIG. 7. In this figure, reference numerals 71 and 72 designate patterns for forming IC chips, numerals 74 and 76 designate reflector groups to be used for registering the patterns 71 and 72, respectively, with a pattern on a mask plate along an X-direction, and numerals 73 and 75 designate reflector groups to be used for registering the patterns 71 and 72, respectively, with a pattern on a mask plate along a Y-direction.

Owing to the above-described features, the present invention makes it possible to quickly and easily register a pattern on a semiconductor wafer with a pattern on a mask plate.

Since many changes could be made in the above construction and many apparently widely different embodiments of this invention could be made without departing from the scope thereof, it is intended that all matter contained in the above description or shown in the accompanying drawings shall be interpreted as illustrative and not as a limitation to the scope of the invention.

What is claimed is:

1. An apparatus for registering a pattern on a mask plate with a pattern already formed on a semiconductor wafer; characterized in that said apparatus comprises means for holding said semiconductor wafer, means for holding said mask plate, an optical system including a lens for focusing an image of the pattern of said mask plate on said semiconductor wafer, a light source for irradiating a wafer held by said wafer holding means, said mask plate having a plurality of windows having a predetermined shape, aligned at a predetermined pitch along a predetermined direction, said wafer having a plurality of reflectors of a predetermined shape aligned at a predetermined pitch along a predetermined direction, one of said windows and said reflectors being directed into first and second groups, said first and second groups being provided with a staggered phase relationship equal to a multiple of one half of said predetermined pitch, means for moving one of said wafer and said mask plate relative to the other, and first and second photo-sensitive means adapted to receive light emitted from said light source, reflected by reflectors formed on said semiconductor wafer and passed through said windows formed on said mask plate, said first photo-sensitive means being responsive to light received from said first group and said second photo-sensitive means being responsive to light received from said second group, whereby the relative position of said wafer and said mask plate are determined when the detected quantities of light received by said first and second photo-sensitive means take a predetermined proportion to thereby register the pattern on said mask plate with the pattern already formed on said semiconductor wafer.

2. The apparatus of claim 1 wherein each of said reflectors comprises a large number of small reflector regions of predetermined shape.

3. The apparatus of claim 1 wherein each of said reflectors comprises a large number of small reflector regions of predetermined shape which can reflect only a small quantity of light, said small reflector regions being surrounded by regions adapted to reflect a large quantity of light.

4. The apparatus of claim 1 wherein the relative position of said wafer and said mask is determined when the quantity of light received by said first photo-sensitive means and the quantity of light received by said second photo-sensitive means are equal.

5. The apparatus of claim 1 wherein said reflectors are formed on a cutting line between adjacent integrated circuit chips on said semiconductor wafer.

* * * * *